US009767996B2

(12) United States Patent
O'Neill et al.

(10) Patent No.: US 9,767,996 B2
(45) Date of Patent: Sep. 19, 2017

(54) APPLICATION OF POWERED ELECTROSTATIC FARADAY SHIELD TO RECONDITION DIELECTRIC WINDOW IN ICP PLASMAS

(71) Applicant: Lam Research Corporation, Fremont, CA (US)

(72) Inventors: Robert G. O'Neill, Hayward, CA (US); Neil M. P. Benjamin, East Palo Alto, CA (US); Jie Zhang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 48 days.

(21) Appl. No.: 14/832,901

(22) Filed: Aug. 21, 2015

(65) Prior Publication Data

US 2017/0053782 A1 Feb. 23, 2017

(51) Int. Cl.
*H01L 21/306* (2006.01)
*H01J 37/32* (2006.01)
(52) U.S. Cl.
CPC .... *H01J 37/32651* (2013.01); *H01J 37/3244* (2013.01); *H01J 37/32119* (2013.01); *H01J 37/32623* (2013.01); *H01J 37/32697* (2013.01)
(58) Field of Classification Search
CPC ........... H01J 37/32623; H01J 37/32633; H01J 37/32642; H01J 37/32651; H01J 37/32119; H01J 37/3244; H01L 21/3065; H01L 21/31116
USPC .............. 156/345.3, 345.33, 345.34, 345.48; 438/706, 710, 712, 714
See application file for complete search history.

(56) References Cited

U.S. PATENT DOCUMENTS

| 7,201,174 | B2 * | 4/2007 | Fukiage | B08B 7/00 134/1.1 |
| 7,223,321 | B1 * | 5/2007 | Comendant | H01J 37/321 118/723 AN |
| 8,436,318 | B2 * | 5/2013 | Sinclair | H01J 27/16 250/423 R |
| 9,490,106 | B2 * | 11/2016 | Drewery | H01J 37/32651 |
| 2004/0065344 | A1 * | 4/2004 | Oka | B08B 7/0035 134/1.1 |
| 2007/0181257 | A1 | 8/2007 | Comendant et al. | |

(Continued)

FOREIGN PATENT DOCUMENTS

EP 0 607 797 A1 7/1994
EP 0 801 413 A1 10/1997

*Primary Examiner* — Lan Vinh
(74) *Attorney, Agent, or Firm* — Beyer Law Group LLP

(57) ABSTRACT

Disclosed herein are various embodiments, including an electrostatic screen for use in a plasma processing chamber with a plurality of electrical leads. A plurality of petal groups is provided with each petal group comprising a substantially-flat structure, wherein each petal group is electrically connected to at least one electrical lead of the plurality of electrical leads and wherein each petal group is insulated from any other petal group, wherein the plurality of petal groups form a radial symmetry around a vertical axis. Each substantially flat structure comprises a sector of a conductive annulus and a plurality of conductive petals, each connected to the sector of the conductive annulus, wherein the at least one electrical lead is connected to substantially equal potential locations in each petal group.

17 Claims, 6 Drawing Sheets

(56) References Cited

U.S. PATENT DOCUMENTS

2013/0160949 A1* 6/2013 Sakka ............... H01J 37/32119
　　　　　　　　　　　　　　　　　　　　156/345.48
2013/0186568 A1* 7/2013 Long ................. H01J 37/32651
　　　　　　　　　　　　　　　　　　　　156/345.49

* cited by examiner

APPLICATION OF POWERED ELECTROSTATIC FARADAY SHIELD TO RECONDITION DIELECTRIC WINDOW IN ICP PLASMAS

BACKGROUND

This disclosure relates to inventions relating to reconditioning dielectric windows in the context of inductively coupled plasma (ICP) processing chambers.

SUMMARY

Disclosed herein are various embodiments, including an electrostatic screen for use in a plasma processing chamber with a plurality of electrical leads. A plurality of petal groups is provided with each petal group comprising a substantially-flat structure, wherein each petal group is electrically connected to at least one electoral lead of the plurality of electrical leads, and wherein each petal group is insulated from any other petal group, wherein the plurality of petal groups form a radial symmetry around a vertical axis. Each substantially flat structure comprises a sector of a conductive annulus and a plurality of conductive petals, each connected to the sector of the conductive annulus, wherein the at least one electrical lead is connected to substantially equal potential locations in each petal group.

In another manifestation, a method of using and maintaining a plasma processing chamber is provided. A substrate is placed in an inductively coupled plasma processing chamber. A processing gas is flowed into the plasma processing chamber. Inductively coupled power is provided to the plasma processing chamber through a floating electrostatic shield and a dielectric window. The flow of the processing gas and the providing the inductively coupled power are stopped. The substrate is removed from the plasma processing chamber. A window conditioning gas is flowed into the plasma processing chamber. Inductively coupled power is provided to the plasma processing chamber through the electrostatic shield and the dielectric window. RF power is provided to the electrostatic shield. The flow of the window conditioning gas and the providing the inductively coupled power and the RF power are stopped.

These and other features of the present inventions will be described in more detail below in the detailed description and in conjunction with the following figures.

BRIEF DESCRIPTION OF THE DRAWINGS

The disclosed inventions are illustrated by way of example, and not by way of limitation, in the figures of the accompanying drawings and in which like reference numerals refer to similar elements and in which.

DETAILED DESCRIPTION

Inventions will now be described in detail with reference to a few of the embodiments thereof as illustrated in the accompanying drawings. In the following description, specific details are set forth in order to provide a thorough understanding of the present invention. However, the present invention may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

Inductively coupled plasma (ICP), also known as transformer coupled plasma (TCP), is widely used in today's conductor etch tools. For example the KIYO® series of etch tools provided by Lam Research Corporation uses a planar inductive coil. In chambers that use TCP, although the desired mechanism is magnetic induction for energizing the plasma, unavoidably voltages between different parts of the coil couple to the plasma capacitively and to some extent undesirably, although this coupling facilitates ignition and stability. In order to control and to make more uniform the capacitively coupled portion, an electrostatic shield may be employed. The capacitively coupled portion of the energy may induce locally strengthened voltages across the plasma sheath, which may accelerate ions from the plasma to impact the dielectric window locally, which causes localized sputter damage. In other circumstances the capacitive coupling may cause localized deposition. Therefore any dielectric window between the coil and plasma may be sputtered by the plasma ions. The sputtering may be aggregated at the areas directly underneath the coil. During wafer processing, the sputtering may cause the plasma facing surface coating on the window to be damaged and then particles may fall off and possibly land on the production wafer and cause defects. As the window ages, this defect generation mechanism has been observed to worsen, likely due to the accumulation of damaged layer on the window coating.

For example, if a window has an yttrium containing plasma facing surface, during plasma processing with a fluorine containing plasma, some of the yttrium may be converted to yttrium fluoride particles. The formation of such particles may be non-uniform, with a greater formation of such particles directly under the coil. During a waferless clean process to remove such particles, the cleaning would also be non-uniform, with most of the cleaning directly below the coil, and areas away from the coil just being marginally cleaned. As a result, the resulting window would have a non-uniform distribution of yttrium fluoride particles, which could provide contamination.

It is therefore useful to have ways in which such window defects may be minimized or reversed.

Figure 1:
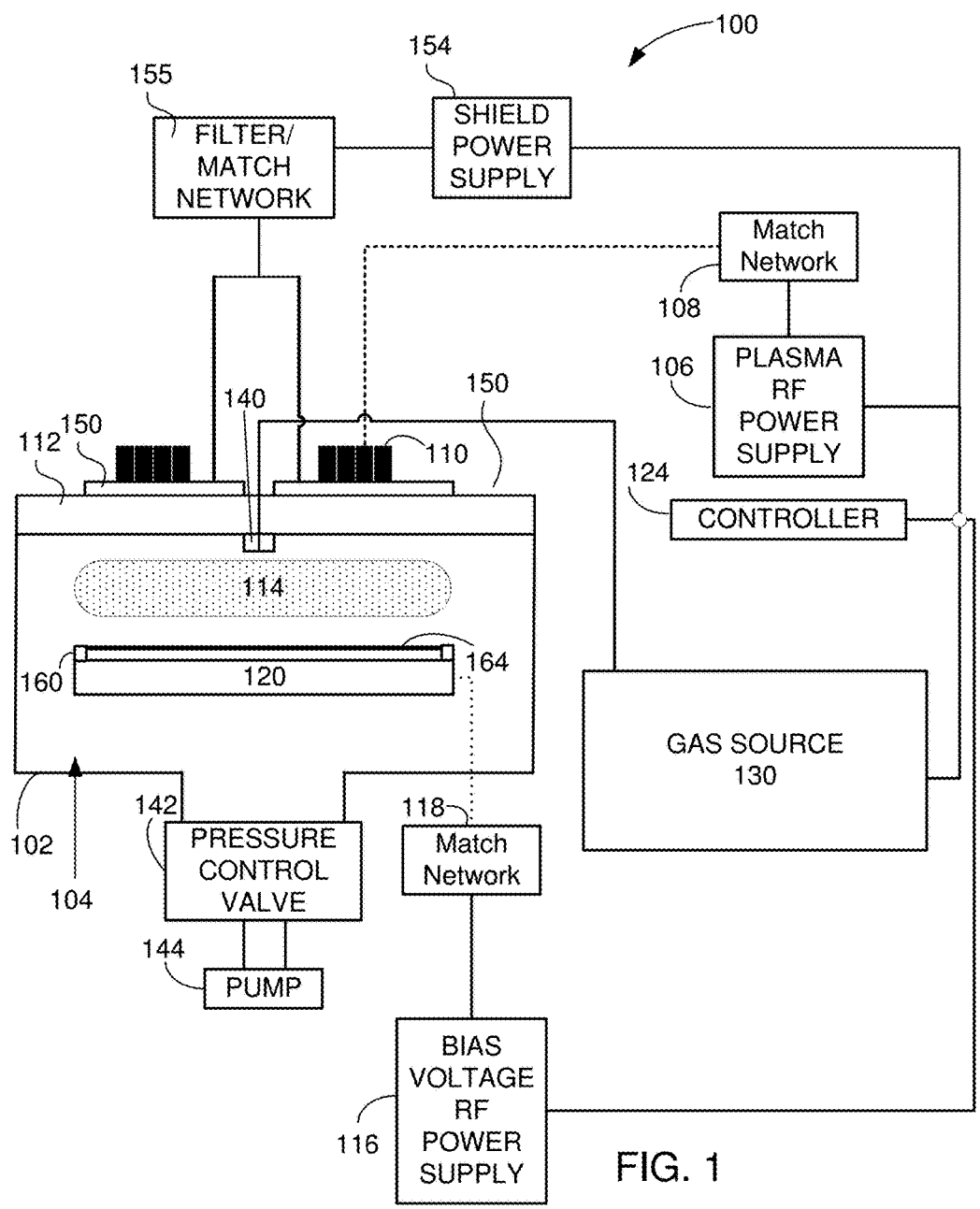
FIG. 1 is a schematic perspective view of a plasma chamber with a shield above the window.

To facilitate understanding, FIG. 1 schematically illustrates a cross-sectional view of an example of a plasma processing chamber 100 which may be used in an embodiment. The plasma processing chamber 100 includes a plasma reactor 102 having a plasma processing confinement chamber 104 therein. A plasma RF power supply 106, tuned by a match network 108, supplies power to a TCP (Transformer Coupled Plasma) coil 110 located near a dielectric window 112 to create a plasma 114 in the plasma processing confinement chamber 104 by providing an inductively coupled power. The TCP coil (upper power source) 110 may be configured to produce the plasma 114 within the plasma processing confinement chamber 104. The dielectric power window 112 is provided to maintain a vacuum in the plasma processing confinement chamber 104 while allowing energy to pass from the TCP coil 110 to the plasma processing confinement chamber 104. A wafer bias voltage RF power supply 116 tuned by a match network 118 provides power to an electrode 120 to set the bias voltage on the substrate 164 which is supported by the electrode 120. A controller 124 sets points for the plasma RF power supply 106, gas source/gas supply mechanism 130, and the wafer bias voltage RF power supply 116.

The shield power supply 154, the plasma RF power supply 106 and the wafer bias voltage RF power supply 116 may be configured to operate at specific radio frequencies such as, for example, 13.56 MHz, 27 MHz, 2 MHz, 60 MHz, 400 kHz, 2.54 GHz, or combinations thereof or may be frequency tuned to a frequency of ±10% from a nominal. Plasma power supply 106, shield power supply, and wafer bias voltage RF power supply 116 may be appropriately sized to supply a range of powers in order to achieve desired process performance. For example, in one embodiment of the present invention, the plasma RF power supply 106 may supply the power in a range of 50 to 5000 Watts, and the wafer bias voltage RF power supply 116 may supply a bias voltage of in a range of 20 to 2000 V. In addition, the TCP coil 110 and/or the electrode 120 may be comprised of two or more sub-coils or sub-electrodes, which may be powered by a single power supply or powered by multiple power supplies.

As shown in FIG. 1, the plasma processing chamber 100 further includes a gas source/gas supply mechanism 130. The gas source 130 is in fluid connection with plasma processing confinement chamber 104 through a gas inlet, such as a gas injector 140. The process gases and byproducts are removed from the plasma process confinement chamber 104 via a pressure control valve 142 and a pump 144, which also serve to maintain a particular pressure within the plasma processing confinement chamber 104. The pressure control valve 142 can maintain a pressure of less than 1 Torr during processing. An edge ring 160 is placed around the wafer 164. The gas source/gas supply mechanism 130 is controlled by the controller 124. A KIYO® by Lam Research Corp. of Fremont, Calif., may be used to practice an embodiment.

This embodiment further includes a electrostatic shield 150. A shield power supply 154 is electrically connected to the electrostatic shield 150 through a filter/match network 155, which is an isolation filter and match network. The filter/match network 155 may be used to provide a power frequency to the electrostatic shield 150 to be a different frequency than the frequency of the plasma RF power supplied to plasma RF power supply 106. The use of different frequencies reduces cross coupling between the electrostatic shield 150 and the coils 110. The shield power supply 154 may be controllably connected by the controller 124. The combination of the electrostatic shield 150 and the power supply 154 provide an Energized Radial Grid.

To prevent shorting of inductive coupling the electrostatic shield is floating and formed in radially spoked petals. The radially spoked petals are joined to a segmented annulus. The annulus allows an electrical connection between the RF source and the radially spoked petals. An inner annulus is preferable with curved petals. The radially spoked petals prevents eddy currents. Segmenting the annulus also reduces eddy currents. Although a connection at the radial center may be beneficial, the presence of a gas injector, a grounded sleeve, and other features at the radial center prevents such a connection. Radial slits divide the petal groups. By symmetrically connecting the RF power source to the petal groups, there is no current flow between the petal groups and the capacitive coupling between the petal groups and the plasma is made more uniform, since the symmetrical connecting connects the petal groups in phase at substantially equal potential locations. Such a symmetrical connection may be defined as being at equal angles from start points of each petal group.

The electrostatic shield may be of a conductive material such as tungsten, copper, silver, aluminum, tantalum, or molybdenum. The electrostatic shield may be sandwiched in a disk of dielectric material for support.

Figure 2:
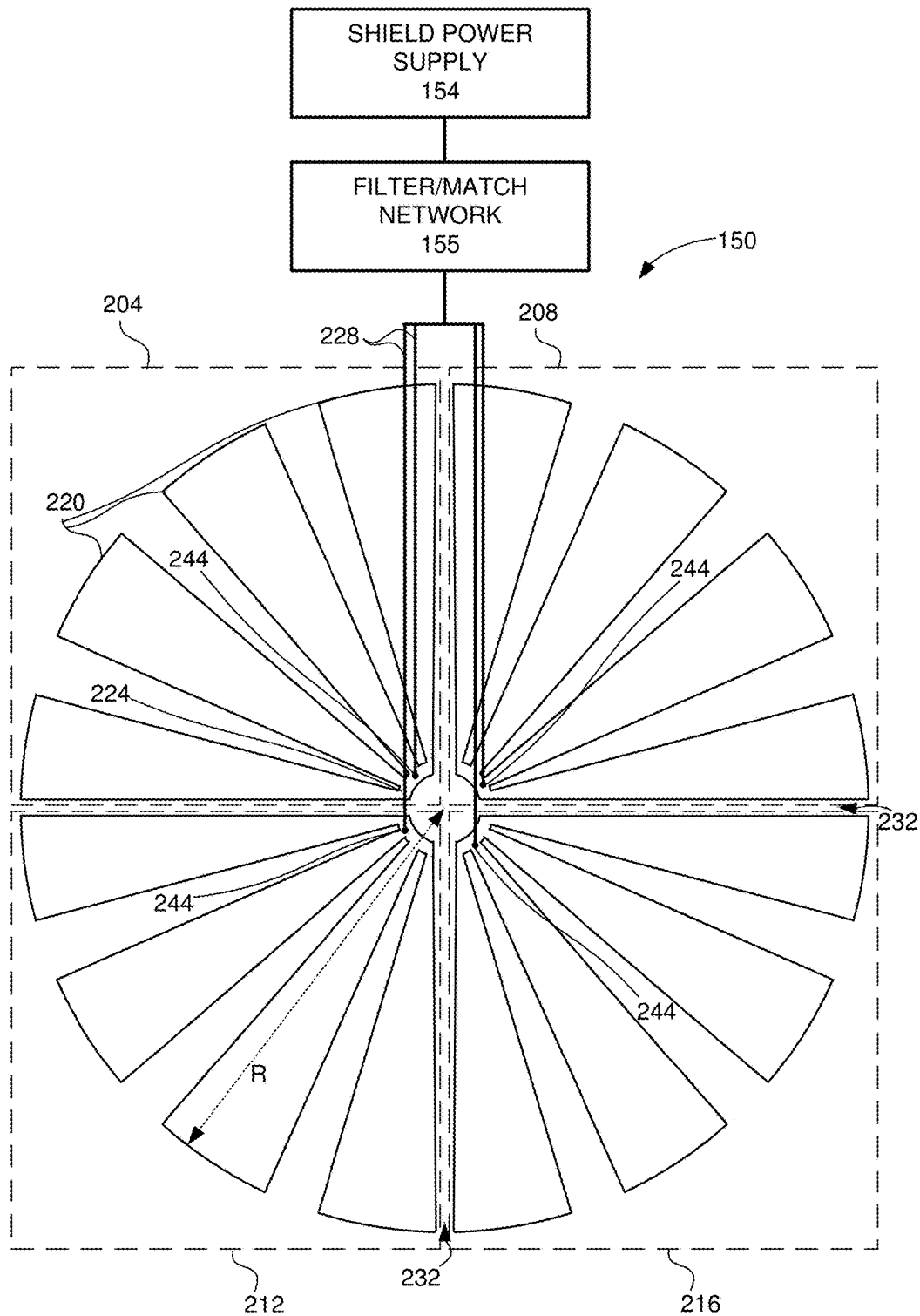
FIG. 2 is a schematic top view of a shield.

FIG. 2 is a top view of the electrostatic Shield 150. In this embodiment, the electrostatic shield comprises a first petal group 204, a second petal group 208, a third petal group 212, and a fourth petal group 216. The plurality of petal groups 204, 208, 212, 216 comprise a plurality of substantially radial petals 220 and a sector of a conductive annulus 224, which joins the radial petals 220 of a petal group 204, 208, 212, 216. The shield power supply 154 is electrically connected by electrical leads 228 in parallel to each petal group 204, 208, 212, 216 at corresponding substantially equal potential locations 244 within each petal group through the filter/match network. Substantially equal potential locations 244 are locations that during processing would be within 10 volts of each other when powered. In this embodiment, the substantially equal potential locations are symmetrical locations within each petal group. In this example, the symmetrical locations are adjacent to the second petal of each petal group 204, 208, 212, 216 in a counter-clockwise direction. Other embodiments may use other symmetrical locations, such as in the middle of each sector of a conductive annulus 224 or at an end or other similar locations. In this example, the electrostatic shield 150 is flat or substantially flat. In addition, a non-conductive space 232 is between each petal group 204, 208, 212, 216 so that the petal groups are insulated from each other. As shown, the petals 220 and petal groups 204, 208, 212, 216 have a substantially radial symmetry about the center of the electrostatic shield 150, which forms a central axis. As shown, the non-conductive space 232 is in the form of radial slits.

The petals are radial is defined as that the petals extend from an inner point to an outer point with a radial component of at least 80% of a radius of the substrate. In this embodiment, the radius of the electrostatic shield 150 is shown by the double arrow dashed line R. In this embodiment the radius of the electrostatic shield is approximately the same as the radius of the substrate 160. In one example, the substrate may have a radius of approximately 150 mm. The conductive annulus 224 may have a diameter of about 40 mm. Therefore the radial component of each radial petal is about 110 mm, which is greater than 80% of the radius of the substrate. In this example the radial component of each radial petal 220 is the length of each radial petal 220. Therefore, as shown, the radial component of each radial petal 220 is greater than 80% of the radius of the substrate. In addition, the thickness or radial component of the annulus is no more than 10% of the radius of the substrate. Such a small radial component reduces eddy currents in the annulus.

The Energized Radial Grid (ERG) is a radial grid that can be sandwiched between the induction coil 110 and dielectric window 112 in an Inductively Coupled Plasma (ICP) setup. It can be grounded, floating, or driven by Radio Frequency (RF) through the sector of the conductive annulus 224.

Figure 3:
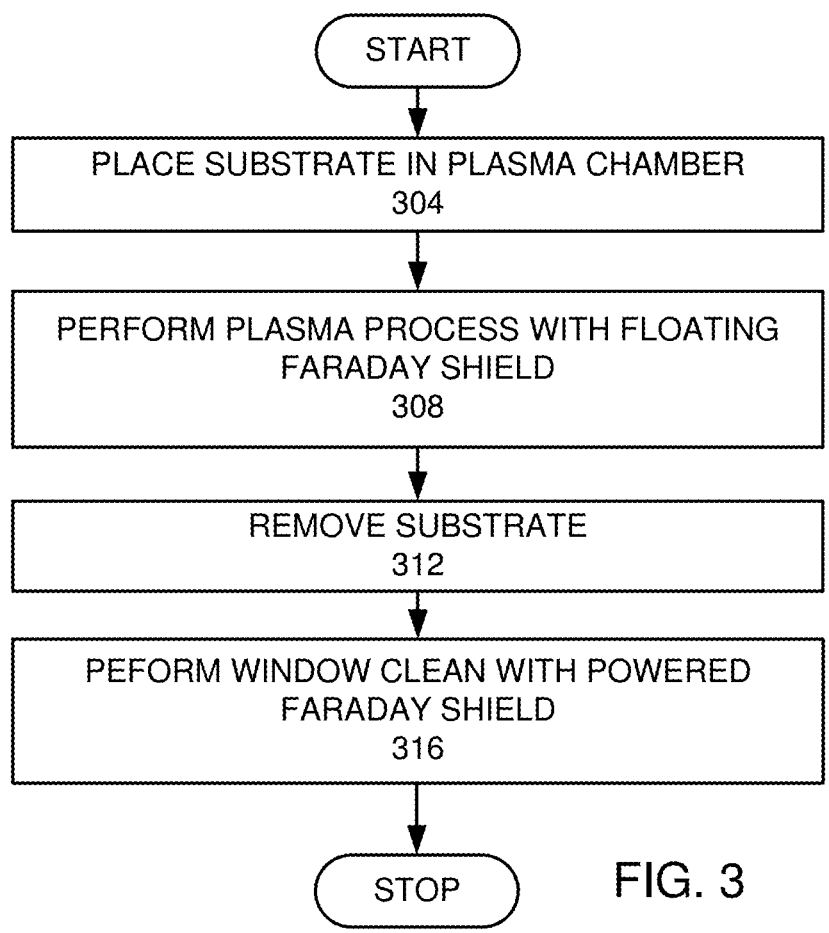
FIG. 3 is a high level flow chart of an embodiment.
Figure 4A:
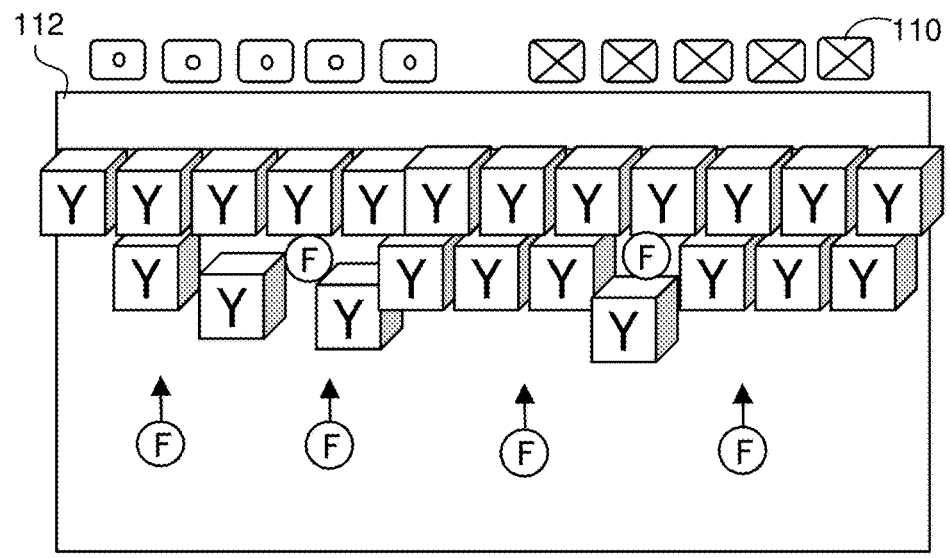
FIGS. 4A-D are schematic illustrations of the exfoliation of a fluorinated plasma-facing window surface.
Figure 4B:
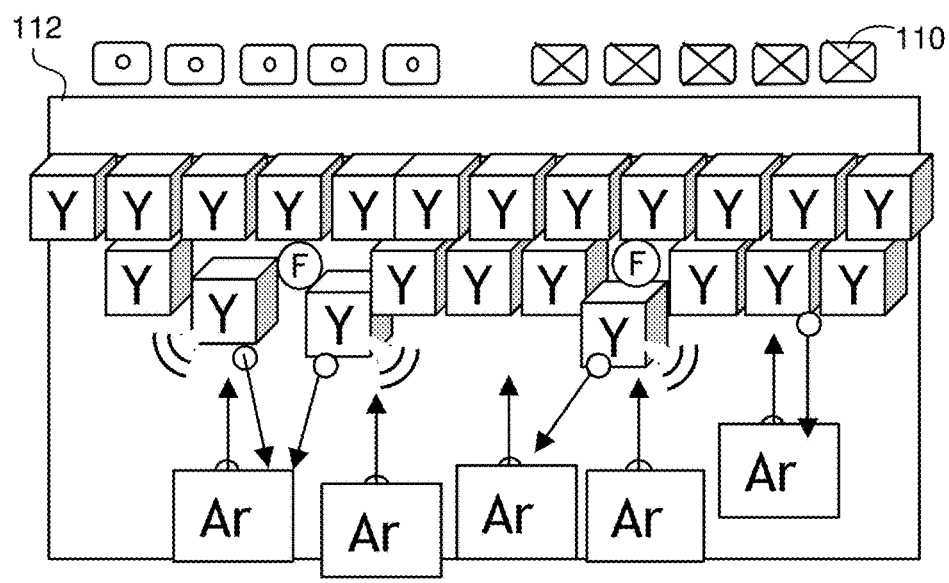
Figure 4C:
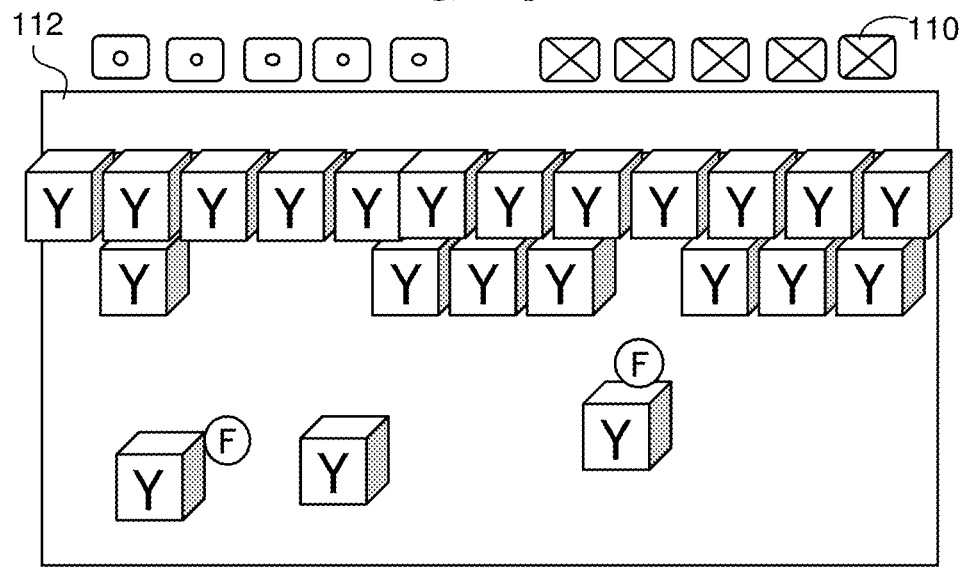
Figure 4D:
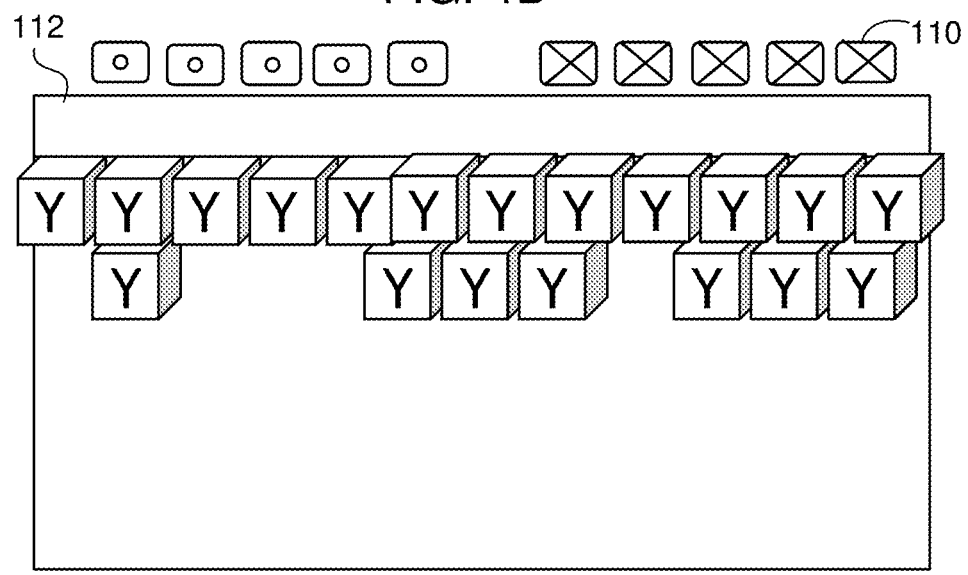

FIG. 3 is a flow chart of an embodiment. A substrate 164 is placed in the plasma processing chamber 104 (step 304). A plasma process is performed on the substrate 164, where the electrostatic shield 150 is floating (step 308). In this example, the shield power supply 154 is used as a switch to allow the electrostatic shield 150 to a state 1 to float. Other types or separate switches may be used in other embodiments. FIG. 4A is an enlarged schematic view of the dielectric window 112 of yttium Y. While the plasma process is performed, fluorine ions F are directed towards the dielectric window 112, as shown. The floating electrostatic shield distributes the fluorine ion bombardment over the dielectric window 112 surface, instead of allowing the bombardment to be concentrated below the coil 110. If the process is continued, the yttrium fluoride would produce particles, which would contaminate the substrate or subsequent substrates. The substrate is removed from the plasma processing chamber (step 312). A window clean is performed with a powered electrostatic shield (step 316). In such an embodiment, a window cleaning gas is flowed into the plasma processing chamber. In this embodiment, the window cleaning gas comprises argon Ar, oxygen, and nitrogen trifluoride. The coil 110 is powered to form the window cleaning gas into a plasma. The shield power supply 154 may be switched to a state 2, so that the electrostatic shield is powered. The power from the coil 110 and the electrostatic shield causes the argon ions to sputter off of the dielectric window 112. FIG. 4B is a schematic illustration of the Ar ions sputtering off of the dielectric window 112 to exfoliate the modified window surface removing yttrium fluoride particles. FIG. 4C is a schematic illustration of the resulting removal of the yttrium fluoride particles. FIG. 4D schematically illustrates the reconditioned yttrium dielectric window 112 surface.

The usage of ERG on semiconductor processing chambers has two distinct advantages. On one hand, when the production wafer is present in the chamber, a floating ERG can smear out the high voltage areas on the window directly beneath the induction coil (due to the capacitive coupling between the coil and plasma sheath), reducing the sputtering at these "hot spots" on window, therefore reduce the falling-on particles on wafer. On the other hand, during the waferless clean steps, an RF-driven ERG can accelerate and intensify the intentional sputtering over the whole window. Further combined with specific chemistries, these clean steps can exfoliate the damaged layer of the window, therefore recondition its plasma facing surface. Both aspects improve the particle performance of the ICP processing tools, especially on the reduction of the fall-on particles.

It is the first time that the electrostatic shield is used to recondition the dielectric window in ICP plasmas. The specific $Ar/NF_3/O_2$ chemistry is also found to be effective in reconditioning the window plasma facing surface, and is more reliable when combining with the ERG.

Figure 5:
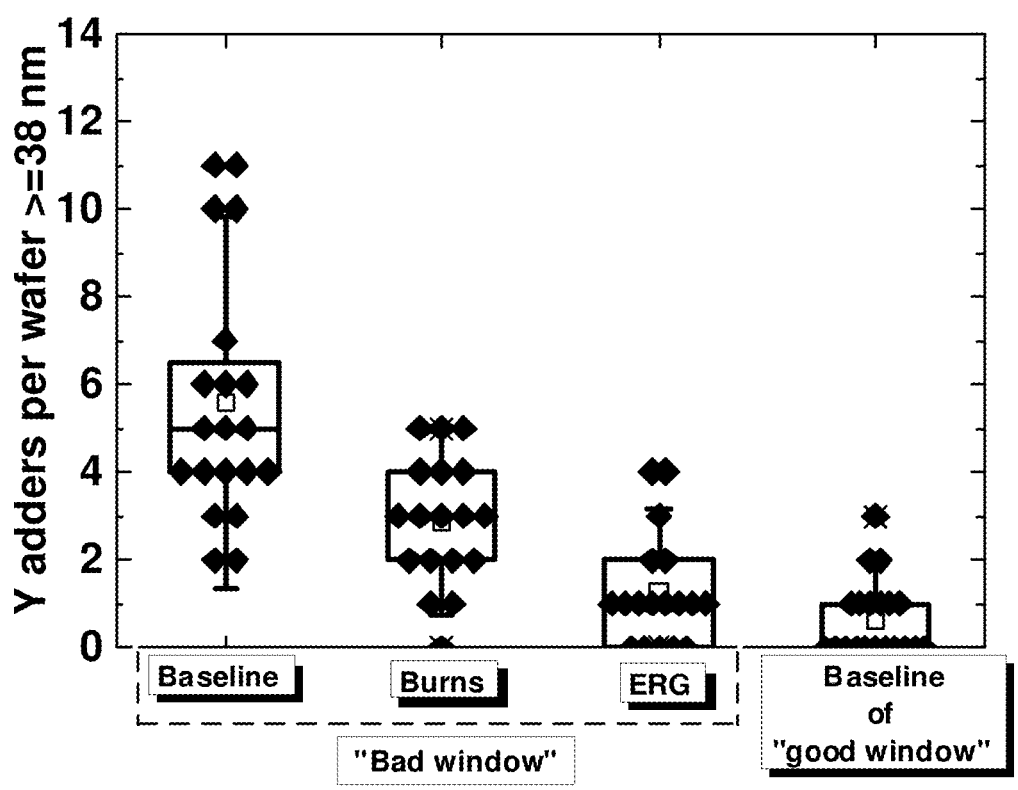
FIG. 5 is a graph showing the number of yttrium particle adders per wafer larger than 38 nm, in various chamber configurations.

FIG. 5 demonstrates that the ERG can reduce Y particle in preliminary tests. The plasma facing surface of the TCP window is fully coated with Yttria, therefore the number of Yttrium-containing adders per wafer (size >=38 nm) is used to assess the particle performance with different configurations. The particle performance of two TCP windows on KIYO® EX-PTK chambers is presented here: a "good" window plotted at the rightmost group, which consistently shows <2.0 Y per wafer up to 82 RF hours with baseline configuration (without ERG); and a "bad" one plotted in the first group, showing a rapid drift-up and on average ~5.6 Y per wafer in baseline (to 62 RF hours). The following ERG and Ar/NF3/O2 cocktail burn tests were carried out with this "bad" window. Without the ERG, the best performance achieved is with 30 minutes of precondition running the cocktail burn. In this configuration, the Y adder is reduced to 2.8 per wafer, shown in the second group. As shown in the third group, with the ERG, and powering it during the inserted 30 seconds cocktail step in between-wafer clean, the level of Y adders is comparable with the "good" window.

In some embodiments the electrostatic shield is floated during wafer processing. In other embodiments, the electrostatic shield is powered during wafer processing. Such RF powering would provide another control knob.

Various embodiments may have different numbers of petal groups. Petal groups may be symmetrical to related coils. For example, for a two-fold azimuthally symmetric coil a two petal group electrostatic shield may be used.

In other embodiments, the radial petals may not form radial spokes, but may have other configurations, such as being angled or nonlinear, such as curved. In such embodiments, a directional component of the radial petals would be radial, and as defined above the radial component would extend along at least 80% of the radius of the substrate. In other embodiments, the dielectric window may be made of other materials instead of yttria. Other dielectric ceramic materials may be used. Other metal oxides may be used.

In other embodiments, the electrostatic shield is powered by the bias voltage power supply, which allows the elimination of a separate shield power supply. In other embodiments, a petal group may have additional radial petals that are stacked above other radial petals and separated by a dielectric layer.

While inventions have been described in terms of several preferred embodiments, there are alterations, permutations, and various substitute equivalents, which fall within the scope of this invention. There are many alternative ways of implementing the methods and apparatuses disclosed herein. It is therefore intended that the following appended claims be interpreted as including all such alterations, permutations, and various substitute equivalents as fall within the true spirit and scope of the present invention.

What is claimed is:

1. An electrostatic screen for use in a plasma processing chamber with a plurality of electrical leads, comprising:
   a plurality of petal groups, each comprising a substantially-flat structure, wherein each petal group is insulated from any other petal group, and wherein each petal group is electrically connected to at least one electrical lead of the plurality of electrical leads, and wherein the plurality of petal groups form a radial symmetry around a vertical axis; and
   each substantially-flat structure comprises a sector of a conductive annulus, and a plurality of conductive petals, each conductive petal connected to the sector of the conductive annulus and each conductive petal being insulated from other conductive petals except where the conductive petals are connected to the sector of the conductive annulus, wherein the at least one electrical lead is connected to substantially equal potential locations in each petal group.

2. The electrostatic screen of claim 1, wherein the sector of the conductive annulus of each petal group is at the radially-inward end of the petals.

3. The electrostatic screen of claim 1, wherein the sector of the conductive annulus of each petal group is at the radially-outward end of the petals.

4. The electrostatic screen of claim 1, wherein the petal groups are substantially coplanar.

5. The electrostatic screen of claim 1, wherein the petals are formed by slits in the radial direction, the space inside the slits being non-conductive, and wherein the each petal group being insulated from any other petal group is accomplished by providing non-conductive spaces between the petal groups, wherein the non-conducting space between the petal groups also comprise slits in the radial direction.

6. A radio frequency window for use in a plasma processing chamber, comprising:
   a disk of a dielectric material;
   the electrostatic screen of claim 1, positioned above disk of a dielectric material.

7. The window of claim 6, wherein a disk of a dielectric material and the electrostatic screen are integrally formed by co-sintering.

8. The window of claim 7, wherein the electrostatic screen comprises one or more of tungsten, tantalum, copper, silver, aluminum, or molybdenum.

9. The electrostatic screen of claim 1, further comprising a radio frequency source connected to each of the electrical leads.

10. The electrostatic screen of claim 9, wherein the radio frequency source is configured to deliver in-phase power of essentially equal magnitude to each of the petal groups.

11. The electrostatic screen of claim 10, wherein the electrical leads of each of the petal groups are connected in parallel to the radio frequency source by an electrical conductor.

12. The electrostatic screen of claim 9, further comprising a switch with state 1 and state 2, wherein the electrostatic screen is configured such that in state 1, the electrostatic screen is unpowered and electrically floating, and in state 2, the electrostatic screen is connected to the radio frequency source.

13. The electrostatic screen, as recited in claim 1, wherein the substantially equal potential locations are within 10 volts of each other.

14. The electrostatic screen, as recited in claim 1, wherein each sector of the conductive annulus as a radial dimension, which is no more than 10% a radius of a substrate processed in the plasma processing chamber and wherein the radial petals have a radial dimension which is at least 80% of the radius of the substrate processed in the plasma chamber.

15. A method of using and maintaining a plasma processing chamber, comprising:
    placing a substrate in an inductively coupled plasma processing chamber;
    flowing a processing gas into the plasma processing chamber;
    providing inductively coupled power to the plasma processing chamber through a floating electrostatic shield and a dielectric window;
    stopping the flow of the processing gas and the providing the inductively coupled power;
    removing the substrate from the plasma processing chamber;
    flowing a window conditioning gas into the plasma processing chamber;
    providing inductively coupled power to the plasma processing chamber through the electrostatic shield and the dielectric window;
    providing RF power to the electrostatic shield; and
    stopping the flow of the window conditioning gas and the providing the inductively coupled power and the RF power.

16. The method, as recited in claim 15, wherein the plasma processing chamber has a plurality of electrical leads, and wherein the electrostatic shield, comprises:
    a plurality of petal groups, each comprising a substantially-flat structure, wherein each petal group is insulated from any other petal group, and wherein each petal group is electrically connected to at least one electrical lead of the plurality of electrical leads, and wherein the plurality of petal groups form a radial symmetry around a vertical axis; and
    each substantially-flat structure comprises a sector of a conductive annulus, and a plurality of conductive petals, each connected to the sector of the conductive annulus, wherein the at least one electrical lead is connected to substantially equal potential locations in each petal group.

17. The method, as recited in claim 16, wherein the providing RF power to the electrostatic shield comprises delivering in-phase power of essentially equal magnitude to each of the petal groups.

* * * * *